(12) United States Patent
Chuah et al.

(10) Patent No.: US 7,143,191 B2
(45) Date of Patent: Nov. 28, 2006

(54) PROTOCOL MESSAGE COMPRESSION IN A WIRELESS COMMUNICATIONS SYSTEM

(75) Inventors: Mooi Choo Chuah, Marlboro, NJ (US); Tingfang Ji, Highland Park, NJ (US); Subhasis Laha, Aurora, IL (US)

(73) Assignee: Lucent Technologies Inc., Murray Hill, NJ (US)

( * ) Notice: Subject to any disclaimer, the term of this patent is extended or adjusted under 35 U.S.C. 154(b) by 738 days.

(21) Appl. No.: 10/172,504

(22) Filed: Jun. 17, 2002

(65) Prior Publication Data
US 2003/0233478 A1  Dec. 18, 2003

(51) Int. Cl.
G06F 15/16  (2006.01)
(52) U.S. Cl. .................. 709/247; 455/72; 370/477; 370/521
(58) Field of Classification Search .............. 709/247, 709/246; 370/329, 447, 477, 468, 521; 455/3.01, 455/414.1, 72
See application file for complete search history.

(56) References Cited

U.S. PATENT DOCUMENTS

| | | | |
|---|---|---|---|
| 5,953,503 A * | 9/1999 | Mitzenmacher et al. .... | 709/203 |
| 6,751,209 B1 * | 6/2004 | Hamiti et al. ............... | 370/349 |
| 6,883,035 B1 * | 4/2005 | Hannu et al. ............... | 709/247 |
| 6,950,445 B1 * | 9/2005 | Svanbro et al. ............. | 370/477 |
| 6,963,587 B1 * | 11/2005 | Hannu et al. ............... | 370/477 |
| 6,985,965 B1 * | 1/2006 | Hannu et al. ............... | 709/247 |
| 2003/0120813 A1 * | 6/2003 | Majumdar et al. .......... | 709/247 |
| 2003/0145115 A1 * | 7/2003 | Worger et al. .............. | 709/247 |

FOREIGN PATENT DOCUMENTS

EP          0788239 A    8/1997

OTHER PUBLICATIONS

Hans Hannu et al., "Application Signaling Over Cellular Links", Internet-Draft <draft-hannu-rohc-signaling-cellular-00.txt>, Nov. 17, 2000.*

Hans Hannu et al., "RObust GEneric message size Reduction (ROGER)", Internet-Draft <draft-hannu-rohc-roger-01.txt>, Jul. 6, 2001.*

Jian Jun Wu et al, Lightweight SIP/SDP Compression Scheme (LSSCS), Nov. 2001, pp. 67-76, XP00800555.

* cited by examiner

Primary Examiner—Moustafa M. Meky

(57) ABSTRACT

A method, apparatus, system, and computer software for compressing and decompressing a message for transmission. The method of compressing a text message for transmission may include parsing text strings and encoding numerical values with a binary representation and analyzing values of the text strings and populating a session specific codebook with partial strings from the values. The method of compressing a message for transmission may also include parsing the message with a template and generating at least one substring to be transmitted; parsing the at least one substring with entries in a session specific codebook and generating a first part of the compressed message; populating the session specific codebook with entries for unknown field values; parsing any unmatched substrings with entries from a first static dictionary and generating a second part of the compressed message; parsing any still unmatched substrings with entries from a second static dictionary and generating a third part of the compressed message; compressing a remainder of the substrings with a compression algorithm; and combining the first part, the second part, and the third part of the compressed message to obtain a compressed message for transmission.

23 Claims, 4 Drawing Sheets

```
Client              Network-Proxy        Size [bytes]    Time [ms]
|                        |
|---------- INVITE --------->|                620          517+70
|                        |
|<-- 183 Session progress ---|                500          417+70
|                        |
|---------- PRACK ---------->|                250          208+70
|                        |
|<----- 200 OK (PRACK) ------|                300          250+70
|                        |
:                        :
|<...... RSVP and SM .......>|
:                        :
|                        |
|<----- 200 OK (COMET) ------|                450
|                        |                   +
|<------- 180 Ringing -------|                230          567+70
|                        |
|---------- PRACK ---------->|                250          208+70
|                        |
|<----- 200 OK (PRACK) ------|                300
|                        |                   +
|<--------- 200 OK ----------|                450          625+70
|                        |
|---------- ACK ------------>|                230          192+70
```

```
User A                     User B
  |                          |
  |       INVITE F1          |
  |------------------------->|
  |     (100 Trying) F2      |
  |<-------------------------|
  |     180 Ringing F3       |
  |<-------------------------|
  |                          |
  |       200 OK F4          |
  |<-------------------------|
  |        ACK F5            |
  |------------------------->|
  |    Both Way RTP Media    |
  |<========================>|
  |                          |
  |        BYE F6            |
  |<-------------------------|
  |       200 OK F7          |
  |------------------------->|
  |                          |
```

Figure 6

```
User A                     User B   Original   Compressed   Ratio
  |                          |
  |       INVITE F1          |
  |------------------------->|        423         48         8.8
  |     (100 Trying) F2      |
  |<-------------------------|        187         12         15.6
  |     180 Ringing F3       |
  |<-------------------------|        187         12         15.6
  |                          |
  |       200 OK F4          |
  |<-------------------------|        403         31         13
  |        ACK F5            |
  |------------------------->|        197         12         16.4
  |    Both Way RTP Media    |     ----------------------------------
  |<========================>|     Total: 1397    115        12.1
  |                          |
  |        BYE F6            |
  |<-------------------------|        197         15         13.1
  |       200 OK F7          |
  |------------------------->|        181         12         15.1
  |                          |     ----------------------------------
                      Total:          378         27         14.0
```

Figure 7

PROTOCOL MESSAGE COMPRESSION IN A WIRELESS COMMUNICATIONS SYSTEM

CROSS-REFERENCE TO RELATED APPLICATIONS

This application is related to a concurrently filed application by Chuah et al., entitled "Binary Protocol For Session Initiation in a Wireless Communications System", Ser. No. 10/172,505, still pending, the entire contents of which are hereby incorporated by reference.

BACKGROUND OF THE INVENTION

1. Field of the Invention

This invention relates to communications and, more particularly, to protocol message compression for a wireless communications system.

2. Description of Related Art

Two communication technologies are commonly used by the general public; cellular telephony and the Internet. Cellular telephony provides its users with the freedom of mobility—the possibility of being reached with reasonable service quality regardless of location. However, the main service provided by cellular telephony is speech. While flexibility for all kinds of usage (speech, data, video, audio, etc.) has been Internet's strength, its focus has been on fixed connections and relatively large terminals, and the quality of some services (such as Internet telephony) has generally been poor. As technology advances, the Internet and cellular technologies are merging. Future cellular "phones" may contain an IP-stack (internet protocol) and support voice over IP in addition to web-browsing, e-mail, etc. In essence, the Internet is going mobile, or cellular systems are becoming much more than telephony, depending on the point of view.

FIG. 1 shows a conventional network 10 which can be divided into a radio access network (RAN) 12 and a core network (CN) 14. The RAN 12 comprises the equipment used to support wireless interfaces 16a–b between a wireless unit 18a–b and the network 10. The RAN 12 includes NodeBs or base stations 20a–c connected over links (Iub links) 21a–c to radio network or base station controllers (RNC) 22a–b. The interface between the base station and the RNC is referred to as the Iub interface or link, and the interface between two RNCs is referred to as the Iur interface. Currently, both the Iub and Iur interfaces are based on ATM (a synchronous transfer mode), and ATM switches are allowed between NodeBs and RNCs.

The core network 14 includes the network elements that support circuit-based communications as well as packet-based communications. In establishing a circuit channel to handle circuit-based communications between the wireless unit 18b and a public switched telephone network (PSTN) 24 or another wireless unit, the base station 20b receives (in the uplink) and transmits (in the downlink), the coded information (circuit voice or circuit switched data) over the wireless interface or link 16b. The RNC 22b is responsible for frame selection, encryption and handling of access network mobility. The RNC 22b forwards the circuit voice and circuit switched data over a network, such as an ATM/IP network to a 3G mobile switching center (MSC) 30. The 3G-MSC 30 is responsible for call processing and macro-mobility on the MSC level. The 3G-MSC 30 establishes the connectivity between the wireless unit 18b and the PSTN 24.

Commonly used terms in this technical field are "all-IP" and "IP all the way". These terms both relate to the case where an IP is used end to end, even if the path involves cellular links, and IP is also run over the radio hop(s). This is done for all types of traffic, both the user data (e.g. voice or streaming) and control signaling data, either SIP (session initiation protocol) or RTSP (real time streaming protocol). A benefit of this is the service flexibility introduced by IP combined with the freedom provided by continuous mobility. The downside is the relative large overhead the IP protocol suite typically introduces, e.g. due to large headers and text-based signaling protocols.

In cellular systems, the scarce radio resources should be used in an efficient way. It should be possible to support a sufficient number of users per cell, otherwise costs will be prohibitive. Frequency spectrum and thus bandwidth are costly resources in cellular links and should be used carefully.

The ROHC (RObust Header Compression) working group has successfully solved the problem of reducing bandwidth requirements for the header parts of real time protocol (RTP), user datagram protocol (UDP), and IP packets. With this obstacle removed, new possibilities of enhancing mobile internet performance arise. One of these relates to application signaling protocols. Protocols such as SIP, RTSP, and SDP (session description protocol) are typically used to set up and control applications in a mobile Internet. However, the protocol messages are large in size and create delays due to their request/response nature. Compression of these messages would increase spectrum efficiency and reduce transmission delay.

The SIP is an application layer protocol for establishing, modifying and terminating multimedia sessions or calls. These sessions include Internet multimedia conferences, Internet telephony and similar applications. SIP can be used over either TCP (Transmission Control Protocol) or UDP. SIP is a text based protocol, using ISO 10646 in UTF-8 encoding.

The SDP may be used to advertise multimedia conferences and communicate conference addresses and conference tool-specific information. The SDP is also used for general real-time multimedia session description purposes. SDP is carried in the message body of SIP and RTSP messages. SDP is text based using the ISO 10646 character set in UTF-8 encoding.

The RTSP is an application level protocol for controlling delivery of data with real-time properties, such as audio and video. RTSP may use UDP or TCP (or another protocol) as the transport protocol. RTSP is text based using the ISO 10646 character set in UTF-8 encoding.

The above protocols have many similarities. These similarities have implications on solutions to the problems they create in conjunction with the cellular radio access. Their similarities include the following:

Requests and reply characteristics. When a sender sends a request, it stays idle until it has received a response, hence, it typically takes a number of round trip times to conclude a SIP, SDP, or RTSP session.

They are ASCII based. Thus to represent the value 230, 3*8=24 bits are used. A binary representation of the same value, by comparison, would require only 8 bits.

They are large in size in order to provide the necessary information to the session participants.

SIP and RTSP share many common header field names, methods and status codes. Their traffic patterns are also similar. The signaling is carried out primarily during the setup phase. For SIP, this means that the majority of the signaling is carried out to set up a phone call or multimedia session. For RTSP, the majority of the signaling is done before the transmission of application data.

The need for solving the problems caused by the signaling protocol messages is made clear by looking at a typical SIP/SDP Call Setup sequence over a narrow band cellular channel and by studying results from a simple system capacity example. These results indicate that there also would be a gain to the system capacity by reducing the size of the single protocol messages.

FIG. 2 illustrates an example of SIP signaling between two termination points with a wireless link between, and the resulting delay under certain system assumptions.

The one way delay is calculated according to the following equation:

$$OneWayDelay = MessageSize[\text{in bits}]/LinkSpeed[\text{in bits/sec}] + RTT[\text{in sec}]/2 \quad \text{Eq. (1)}$$

where RTT is the round trip time.

The following values have been used:

| | |
|---|---|
| RTT/2: | 70 msec |
| LinkSpeed | 9.6 kbps |

The delay formula in Eq. (1) is based on an approximation of a WCDMA (wideband code division multiple access) radio access method for speech services. For instance, delays caused by possible retransmissions due to errors are ignored.

Applying Eq. (1) to each SIP/SDP message shown in the example of FIG. 2 gives a total delay of 4130 msec from the first SIP/SDP message to the last. The RSVP and Session Management (Radio Bearer setup), displayed in FIG. 2 will add approximately 1.5 seconds to the total delay, using Eq. (1). However, there may also be RSVP and SM signaling prior to the SIP INVITE message to establish the radio bearer, which would add approximately another 1.5 seconds.

The TSG (Technical Specification Group) has performed a comparison between a GSM (Global System for Mobiles) Edge (Enhanced Data Rates for Global Evolution) Radio Access Network (GERAN) call setup using SIP and an ordinary GSM call setup. For a typical GSM call setup, the time is about 3.6 seconds, and for the case when using SIP, the call setup is approximately 7.9 seconds.

A first solution to decrease the call setup using SIP uses a dynamic dictionary and the LZSS (Lempel-Ziv-Storer-Szymanski) compression algorithm. The dynamic dictionary is kept as long as packets belonging to the context keep arriving. Determining whether a packet flow is still active can be done using a timer or from the semantics of the protocol. This solution introduces 2 bytes of overhead for every compressed message.

In this first solution, compression includes the followings steps:

1. Append the message to the dictionary and compress the extended file using LZSS.
2. Separate the part of the compressed file that corresponds to the dictionary from the part which corresponds to the message. This is possible since LZSS processes the file from left to right and the part which has already been compressed does not change as the compression proceeds. That is, compressing the dictionary itself or compressing it with a message appended to it will produce the same output (apart from the compressed message).

In this first solution, decompression includes the following steps:

1. Append the compressed message to the compressed dictionary and decompress the extended file.
2. Separate the message from the dictionary. This is possible because the boundry of the dictionary is known and the message is appended to the dictionary.

The performance of this first solution is as follows. The first message compression ratio is 1.5 and subsequent message compression ratios range from 3.1 to 8.3 depending on the operation modes of the compressor and decompressor. In a limited contact mode, the decompressor can acknowledge messages from the compressor, so that the compressor can make sure that the decompressor has the same dictionary as the compressor. In a full contact mode, the compressor and decompressor are one entity and share the dictionary, so both sent and received messages can be used for the compression process.

A second solution uses LZJH (Lempel-Ziv-Jeff-Heath) as the compression algorithm. This second solution uses preloaded dictionary and a multi-packet mode, where the dictionary is updated using previous messages, and then using the LZJH compression algorithm. This second solution can reduce the first message by a ratio of 2.8.

In summary, when SIP messages are compressed individually using a Lempel-Ziv-type algorithm, the compression ratio is around 1.5. With a preloaded static dictionary, most conventional compression algorithms yield a compression ration of less than 3 for SIP messages. When a codebook is populated by the first INVITE message, Lempel-Ziv-type algorithms improve the compression ratio to close to 5.

Thus, a better solution is needed to further reduce signaling delay and required bandwidth when considering both system bandwidth requirements and service setup delays.

SUMMARY OF THE INVENTION

The present invention is directed to message compression that shortens the call setup time by using multi-packet compression algorithms to compress the messages.

The present invention is also directed to a method, apparatus, system, and software for performing protocol message compression in a wireless communication system. The present invention utilizes a compression algorithm that combines binary coding, templates, session specific codebooks, and/or conventional Lempel-Ziv-based algorithms. The present invention also utilizes a message ID, the binary encoding of some fields, such as a service provider address, a caller user ID, a caller user name, a callee user ID, and a callee user name, and utilizes IPv4 format for domain names. The present invention also enables binary coding of numerical values for some fields. The present invention also provides a session specific codebook, a modified indexing mechanism, codebook management, and session history. Still further, the present invention provides a flexible template with fixed and variable length sub-fields, as well as a flexible template with optional fields. Still further, the present invention provides general purpose lossless text compression. In an exemplary embodiment, the present invention achieves better compression through the use of a session specific codebook and an optional dictionary at the SIP server/media duplicator. Binary encoding of numerical fields also helps reduce the size of IP addresses, caller IDs, session IDs, etc. The present invention also includes a flexible template structure and permits the use of fixed lengths for selected template fields and encodes variable length field with either length indicators or delimiters. The present invention also permits optional fields to be inserted into templates to reduce the total number of templates that need to be stored in memory.

In one exemplary embodiment, the present invention is directed to a method of compressing a text message for transmission comprising parsing text strings and encoding numerical values with the binary representation and analyzing values of the text string and populating a session specific codebook with partial strings from the values. In another exemplary embodiment, the present invention is directed to a method of compressing a message for transmission, comprising parsing the message with a template and generating at least one substring to be transmitted; parsing the at least one substring with entries in a session specific codebook and generating a first part of the compressed message; populating the session specific codebook with entries for unknown field values; parsing any unmatched substrings with entries from a first static dictionary and generating a second part of the compressed message; parsing any still unmatched substrings with entries from a second static dictionary and generating a third part of the compressed message; compressing a remainder of the substrings with a compression algorithm; and combining the first part, the second part, and the third part of the compressed message to obtain a compressed message for transmission.

BRIEF DESCRIPTION OF THE DRAWINGS

Other aspects and advantages of the present invention may become apparent upon reading the following detailed description and upon reference to the drawings in which:

FIG. 6 illustrates an example of user A completing a call user B, in one exemplary embodiment of the present invention.

FIG. 7 illustrates compression results achieved in one exemplary embodiment of the present invention.

DETAILED DESCRIPTION

Figure 1:
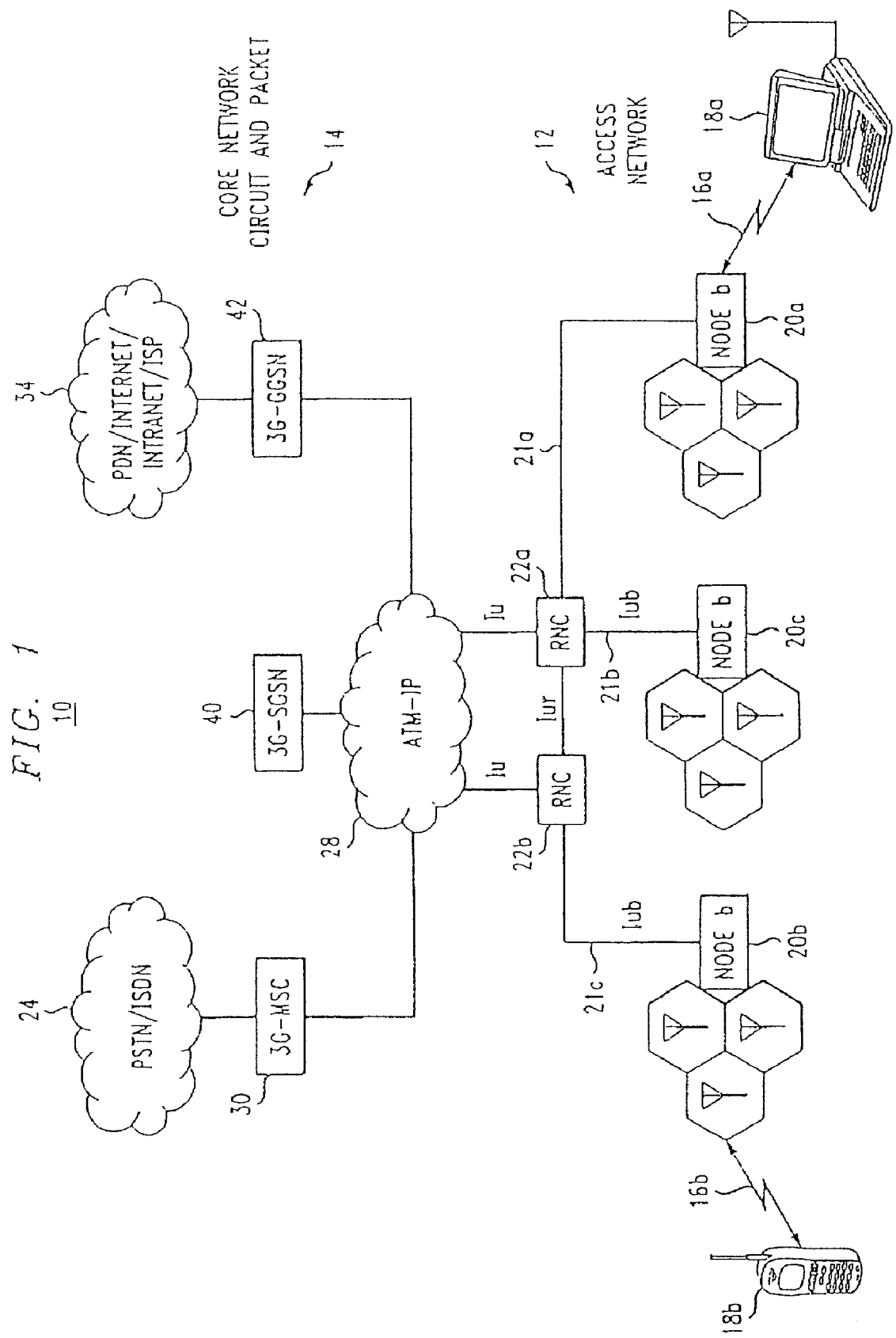
FIG. 1 shows a general block diagram of a conventional network architecture.
Figures 2, 3:
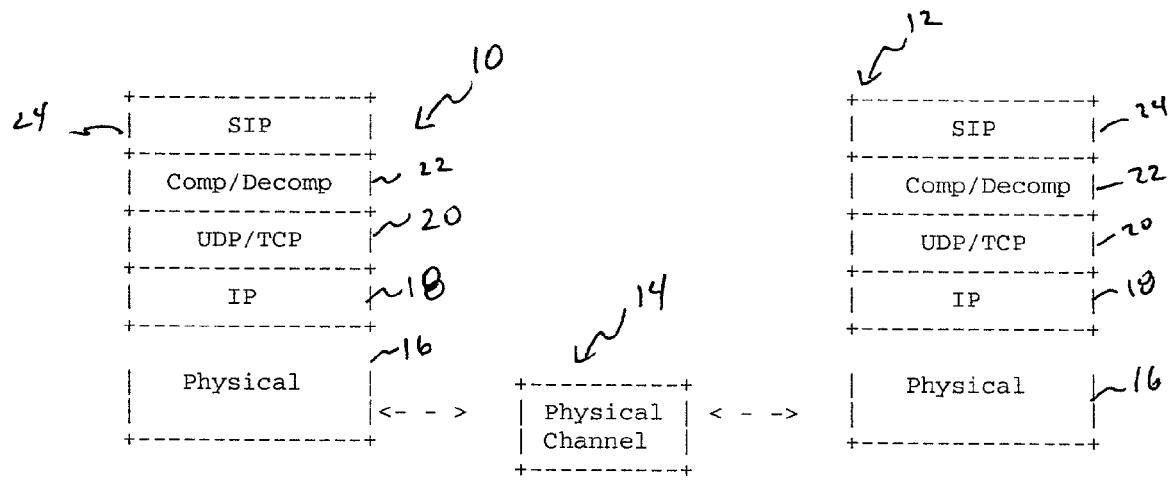
FIG. 2 shows a SIP signaling delays assuming a link speed of 9600 bps and an RTT of 140 msec.
FIG. 3 illustrates an exemplary architecture for performing compression in one exemplary embodiment of the present invention.

FIG. 3 illustrates the environment in which the compression/decompression of SIP messages of the present invention may be performed. As illustrated in FIG. 3, two entities 10, 12 are separated by a physical channel 14. Each entity 10, 12 includes a physical layer 16, and IP layer 18, a UDP/TCP layer 20, the compression/decompression layer 22 of the present invention, and an SIP layer 24.

Figure 4:
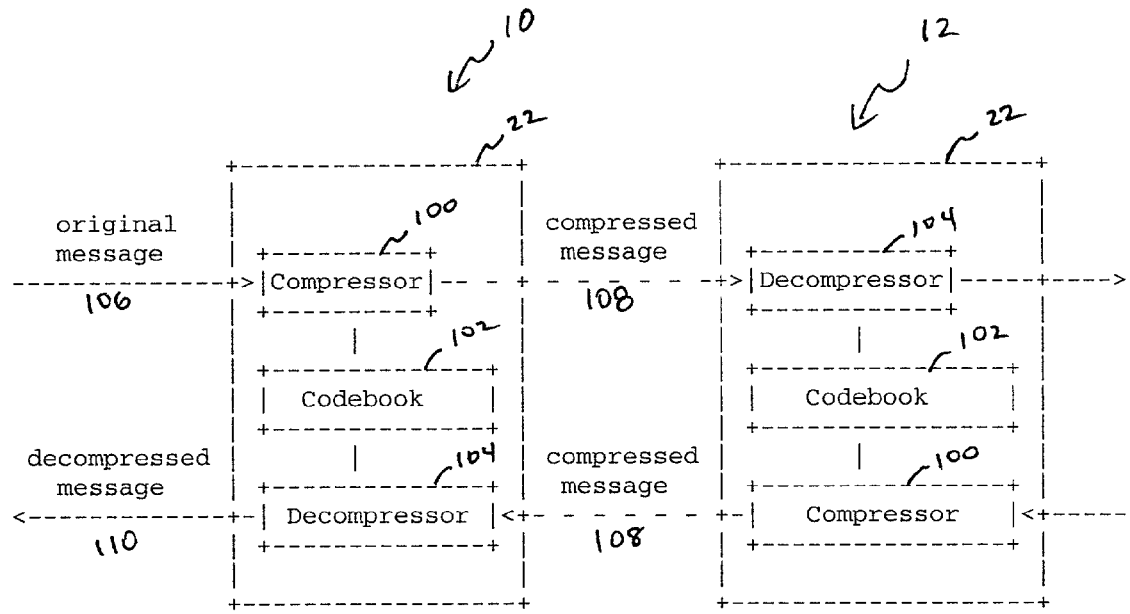
FIG. 4 illustrates an exemplary message compression framework in one exemplary embodiment of the present invention.

FIG. 4 illustrates a message compression framework in one exemplary of the present invention. Within the compression/decompression layer 22, entities 10 and 12 include a compressor 100, a codebook 102, and a decompressor 104, through which original messages 106, compressed messages 108, and decompressed messages 110 are passed.

As illustrated in FIG. 2, the compression mechanism of the present invention serves as the layer 22 between the SIP applications 24 and the UDP and/or TCP 20. The purpose of compression is to reduce the total amount of data across the physical channel 14, thus reduce the delay.

Compression algorithms work well with a priori information of the original message. SIP messages within a session share many common information such the user addresses and port numbers.

SIP messages have many repeated headers which can be easily compressed. Compression algorithms can work with either preloaded dictionaries, dynamic dictionaries or templates. An exemplary static dictionary for SIP messages is shown below.

In the exemplary static dictionary:
Needed spaces are indicated with <sp>
Needed carriage returns are indicated with <cr>
Needed line feeds are indicated with <lf>

All other possible spaces, carriage returns, line feeds etc, should be disregarded when using is exemplary static dictionary.

<Start of static Dictionary>
INVITE<sp>sip:<sp>SIP/2.0<cr><lf>Via:<sp>SIP/2.0/
    UDP<sp>:5060<cr><lf>
From:<sp>To:<sp>Call-ID:<sp>CSeq:
    <sp>1<sp>INVITE<cr><lf>
Contact:<sp>Content-Type:<sp>application/sdp<cr><lf>
Content-Length:<sp>0<cr><lf>SIP/
    2.0<sp>100<sp>Trying<cr><lf>
SIP/2.0<sp>180<sp>Ringing<cr><lf>SIP/
    2.0<sp>200<sp>OK<cr><lf>
SIP/
    2.0<sp>181<sp>Call<sp>Is<sp>Being<sp>Forwarded<cr><lf>
SIP/2.0<sp>182<sp>Queued<cr><lf>SIP/
    2.0<sp>183<sp>Session<sp>Progress<cr><lf>
PRACK<sp>sip:        COMET<sp>sip:ACK<sp>sip:
    BYE<sp>sip:Accept:<sp>Accept-Encoding:<sp>Accept-
    Language:<sp>Allow:<sp>Authorization:<sp>
Content-Encoding:<sp>Content-Length:<sp>Encryption:
    <sp>
Expires:<sp>Hide:<sp>Contact:<sp>Max-Forwards:<sp>
Proxy-Authenticate:<sp>Proxy-Authorization:<sp>Proxy-
    Require:<sp>
Require:<sp>Response<sp>Key:<sp>Route:
    <sp>Timestamp:<sp>
Unsupported:<sp>User-Agent:<sp>WWW-Authenticate:
    <sp>Supported:<sp>
Remote-Party-ID:<sp>Proxy-Require:<sp>Anonymity:
    <sp>
<End of static dictionary>

A template is a table of orderly strings. Compared with dictionaries, fixed header information does not need to be transmitted, thus further reducing the message size. For each type of messages, a default template can be defined. The following is an example of template-based coding.

Figure 5:
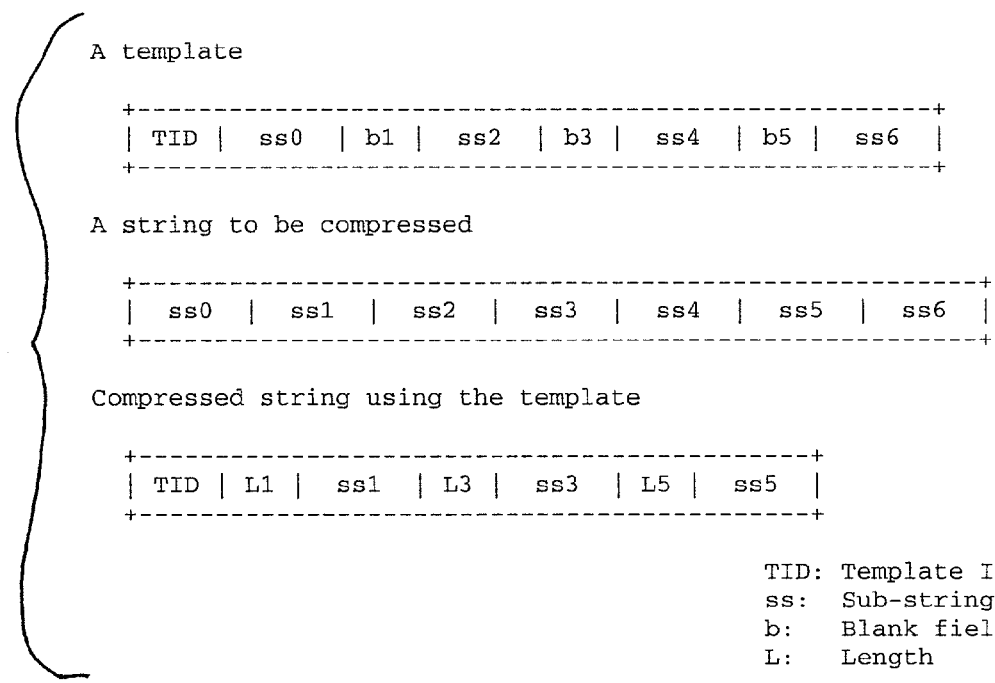
FIG. 5 illustrates template-based coding, in one exemplary embodiment of the present invention.

FIG. 5 is an example of template-based encoding. The template has a template ID (TID), four static fields (ss0, ss2, ss4, and ss6), and three blank fields (b1, b3, and b5). It is assumed that all blank fields have variable lengths. For simplicity, the filling sub-strings (ss1, ss3, and ss5) are encoded in the form of <length, value>. Again for simplicity, it is assumed that the value is the uncompressed form of the original sub-string.

When compared with dictionary-based compression, template-based compression can achieve a higher compression efficiency, as the position and length information of the static parts have already been stored in a template, and do not need to be transferred.

Templates can be defined for each type of messages. When the number of templates grows, the memory associated with templates may be a concern. Alternatively, an additional field can be inserted into a template. A header ID (HID) can be assigned to each header. Then the additional field can be inserted into the compressed string as <HID|Lx|ssx> at the desired position.

As shown in previous studies, compression ratio of the first INVITE message is not significant even with a template-based approach. Since there exists knowledge about the contents of SIP/SDP fields, it is possible to improve the compression performance over general compression algorithms such as Lempel-Ziv-type compression algorithms.

An optional static dictionary can be used for some selected SIP field values. This dictionary could include typical SDP values, such as "IN IP4" for the <network type> <address type> fields of a typical internet sessions. Most UID's (user identifications) can be represented by 4 bytes. A service provider typically has less than 256 million subscribers, hence, the 4 most significant bits can be used to represent a service provider identifier and the remaining bits to represent a username. When a numerical value is expected in a field, a binary representation can be used.

The compression method, in one exemplary embodiment of the present invention, can be summarized as follows:

1) Parse the message with a matching template and generate the substrings that need to be transmitted.

2) Parse the substrings with a session specific codebook (initialized to empty) and generate part of the compressed message.

3) Populate the session specific codebook with unknown field values.

4) Parse the unmatched substrings with a static dictionary and generate part of the compressed message.

5) Parse the unmatched substrings with the optional static dictionary and output part of the compressed message.

6) Compress the rest of the substrings with LZSS.

7) Combine the outputs of steps 2) and 4)–6) as the final compressed message.

It is noted that some substrings in a template can be assigned a default length after compression, which will reduce one byte for each field. A predefined escape character may be used to flag the length change.

The exemplary compression algorithm outlined above is applied to several examples below, where a successful simple SIP to SIP call is established, as illustrated in FIG. 6.

EXAMPLE 1

Message Details

F1 INVITE User A→User B
INVITE sip:UserB@there.com SIP/2.0
Via: SIP/2.0/UDP here.com:5060
From: BigGuy<sip:UserA@here.com>
To: LittleGuy<sip:UserB@there.com>
Call-ID: 12345601@here.com
CSeq: 1 INVITE
Contact: <sip:UserA@100.101.102.103>
Content-Type: application/sdp
Content-Length: 147
v=0
o=UserA 2890844526 2890844526 IN IP4 here.com
s=Session SDP
c=IN IP4 100.101.102.103
t=0 0
m=audio 49172 RTP/AVP 0
a=rtpmap:0 PCMU/8000

Applying step 1, the message is parsed with a matching template and the substrings that need to be transmitted are generated. In Example 1, The result of step 1 is as follows:
Template ID: TID
UserB@there.com
here.com:5060
BigGuy UserA@here.com
LittleGuy UserB@there.com
12345601 ("@here.com" is assumed to be the same as above)
1 INVITE
<100.101.102.103>("sip:UserA@" is assumed to be the same as above)
("application/sdp" assumed to be the same)
147
2890844526 ("UserA" "IN IP4 here.com" taken from above, "2890844526", the version of the annoucement is the same timestamp as session id)
100.101.102.103
49172 ("audio" "RTP/AVP 0")
rtpmap:0 PCMU/8000.

Removing comments, the resulting substrings are:
TID
UserB@there.com
here.com
BigGuy UserA@here.com
LittleGuy UserB@there.com
12345601
1 INVITE
100.101.102.103
147
2890844526
100.101.102.103
49172
rtpmap:0 PCMU/8000.

Applying step 2, the substrings are parsed with a session specific codebook (initialized to empty) to generate part of the compressed message. Since the session specific codebook is empty, no output is generated.

Applying step 3, the session specific codebook is populated with unknown field values. The resulting session specific codebook will be used for compression of subsequent messages. In Example 1, the resulting session specific codebook is as shown in Table 1.

TABLE 1

| Header | Entry |
| --- | --- |
| Index | UserB@there.com |
| Via: | here.com |
| user address | UserA@here.com |
|  | UserB@there.com |
| address_of_record | BigGuy UserA@here.com |
|  | LittleGuy UserB@there.com |
| Call-ID | 12345601 |
| Contact | 100.101.102.103m |
|  | 49172 RTP/AVP 0 |
| A | rtpmap:0 PCMU/8000 |

It is noted in Table 1, that each header is not limited to having one entry. Further, not all unknown fields are used to populate the codebook because some may not repeat, such as the announcement number in SDP. The session specific codebook can then be used to compress/decompress subsequent messages of the same session. It is noted that codebook management may be helpful. For example, when a match with the entry is found, one byte is used to indicate the header in the session profile, and another byte is used to specify which entry is matched for the header.

Applying step 4, the unmatched substrings are parsed with a standard static dictionary, such as the one shown above, and part of the compressed message is generated. In Example 1, since all headers and many constant values are included in the template, no additional output are generated by parsing through the standard static dictionary.

Applying step 5, unmatched substrings are parsed with the static dictionary and part of the compressed message is output.

TABLE 2

| Original Strings | Compression |
| --- | --- |
| UserB@there.com | match "there.com" 1 byte |
| here.com | 1 byte |
| BigGuy UserA@here.com | 4 bytes |
| LittleGuy UserB@there.com | match "there.com" 1 or 0 bytes |
| 12345601 | 8 bytes |
| 1 INVITE | 2 bytes |
| 100.101.102.103 | 4 bytes |
| 147 | 1 byte |
| 2890844526 | 8 bytes |
| 100.101.102.103 | 4 or 0 bytes |
| 49172 | 2 bytes |
| rtpmap:0 PCMU/8000 | 1 byte |

In Example 1, the result of step 5 is 37 or 32 bytes:

It is noted that all domain names may be stored in the optional static dictionary at all SIP entities. In Example 1, 1 byte is assigned for each domain name. At the same time, a 4 byte user address may be assigned to the transmitting SIP entity when the device is initialized.

Applying step 6, the rest of the substrings are compressed with an exemplary compression algorithm, such as LZSS.

The TID can be represented with 1 byte. The user id (the string before '@' in the user address) is 5 bytes long and the user name (LittleGuy) is 10 bytes long. In Example 1, at most 16 bytes will be generated after LZSS compression.

Applying step 7, the outputs of steps 2 and 4–6 are combined as the final compressed message. This results in 37 or 32 bytes plus the 16 generated after LZSS compression.
37+16=53 bytes.
or 32+16=48 bytes, which is a compression ratio of=423/53=8.0; 423/48=8.8.

The following examples describe the steps for subsequent messages.

EXAMPLE 2

Message Details

F2 (100 Trying) User B→User A
SIP/2.0 100 Trying
Via: SIP/2.0/UDP here.com:5060
From: BigGuy<sip:UserA@here.com>
To: LittleGuy<sip:UserB@there.com>
Call-ID: 12345601@here.com
CSeq: 1 INVITE
Content-Length: 0

After decoding message F1 from Example 1, User B has populated the codebook with the content of the INVITE message.

Applying step 1 to Example 2, the following substrings are generated:
TID
here.com
BigGuy UserA@here.com
LittleGuy UserB@there.com
12345601
1 INVITE
0

Applying step 2 to Example 2, the substrings are parsed with a session specific codebook, as shown in Table 3.

TABLE 3

| Original Strings | Compression |
| --- | --- |
| TID | no match |
| here.com | 2 bytes |
| BigGuy UserA@here.com | 2 bytes |
| LittleGuy UserB@there.com | 2 bytes |
| 12345601 | 2 bytes |
| 1 INVITE | no match |
| 0 | no match |

A subtotal of 8 bytes are obtained.

Assuming that the algorithm is in a full contact mode, where the compressor and decompressor share the codebook 102, after UserA transmits the compressed INVITE message, the decompressor 104 at UserA can also access the session specific codebook. When the INVITE message is received by UserB, it populates its session specific codebook, which will be identical to that at UserA. Hence, when the message (100 trying) is compressed and decompressed, the session specific codebook can be used.

Applying step 3, the session specific codebook is populated. In this Example, there are no new strings.

Applying step 4, the standard static dictionary reveals no matches, which results in a second subtotal of 0 bytes.

Applying step 5, the optional static dictionary is parsed, producing Table 4, which results in a third subtotal of 3 bytes.

TABLE 4

| Original Strings | Compression |
| --- | --- |
| TID | no match |
| 1 INVITE | 2 bytes |
| 0 | 1 byte |

Applying the step 6, the rest of the substrings is compressed with LZSS or other exemplary compression algorithm.

TID is a one byte template index, which results in a fourth subtotal of 1 byte.

Applying step 7, the outputs are combined to produce 8+0+3+1=12 bytes, which is a compression ratio of 187/12=15.6.

EXAMPLE 3

Message Details

F3 180 Ringing User B→User A
SIP/2.0 180 Ringing

Via: SIP/2.0/UDP here.com:5060
From: BigGuy<sip:UserA@here.com>
To: LittleGuy<sip:UserB@there.com>
Call-ID: 12345601@here.com
CSeq: 1 INVITE
Content-Length: 0

Apply the same procedure as above for Example 2, the resulting message is 12 bytes, and the compression ratio is 187/12=15.6.

EXAMPLE 4

Message Details

F4 200 OK User B→User A
SIP/2.0 200 OK
Via: SIP/2.0/UDP here.com:5060
From: BigGuy<sip:UserA@here.com>
To: LittleGuy<sip:UserB@there.com>
Call-ID: 12345601@here.com
CSeq: 1 INVITE
Contact: <sip:UserB@110.111.112.113>
Content-Type: application/sdp
Content-Length: 147
v=0
o=UserB 2890844527 2890844527 IN IP4 there.com
s=Session SDP
c=IN IP4 110.111.112.113
t=0 0
m=audio 3456 RTP/AVP 0
   a=rtpmap:0 PCMU/8000

Applying step 1 to Example 4, the following substrings are generated:
TID
UserB@there.com
here.com
BigGuy UserA@here.com
LittleGuy UserB@there.com
12345601
1 INVITE
110.111.112.113
147
2890844527
110.111.112.113
3456
rtpmap:0 PCMU/8000

Applying step 2 to Example 4, the substrings are parsed with the session specific codebook as shown in Table 5, which results in a first subtotal of 16 bytes:

TABLE 5

| Original Strings | Compression |
|---|---|
| TID | no match |
| UserB@there.com | 2 bytes |
| here.com | 2 bytes |
| BigGuy UserA@here.com | 2 bytes |
| LittleGuy UserB@there.com | 2 bytes |
| 12345601 | 2 bytes |
| 1 INVITE | 2 bytes |
| 110.111.112.113 | no match |
| 147 | 2 bytes |
| 2890844527 | no match |
| 110.111.112.113 | no match |
| 3456 | no match |
| rtpmap:0 PCMU/8000 | 2 bytes |

Applying the step 3 to Example 4, the session specific codebook is populated as shown in Table 6:

TABLE 6

| Header | Entry |
|---|---|
| Index | UserB@there.com |
| Via | here.com |
| user address | UserA@here.com |
|  | UserB@there.com |
| address_of_record | BigGuy UserA@here.com |
|  | LittleGuy UserB@there.com |
| Call-ID | 12345601 |
| Contact | 100.101.102.103 |
|  | 110.111.112.113 |
| M | 49172 |
|  | 3456 |
| A | rtpmap:0 PCMU/8000 |

Applying step 4 to Example 4, no match is found in the static dictionary, which results in a second subtotal of 0 bytes.

Applying step 5 to Example 4, reveals several matches as shown below in Table 7, which results in a third subtotal of 14 bytes.

TABLE 7

| Original Strings | Compression |
|---|---|
| TID | no match |
| 110.111.112.113 | 4 bytes |
| 2890844527 | 8 bytes |
| 110.111.112.113 | 0 (same as above) |
| 3456 | 2 bytes |

Applying step 6 to Example 4, the rest of the substring, a one byte template index for the TID, is compressed with LZSS to produce another 1 byte subtotal.

Combining the outputs for Example 4 gives 16+14+1=31 bytes, which is a compression ratio: 403/31=13.

EXAMPLE 5

Message Details

F5 ACK User A→User B
ACK sip:UserB@there.com SIP/2.0
Via: SIP/2.0/UDP here.com:5060
From: BigGuy<sip:UserA@here.com>
To: LittleGuy<sip:UserB@there.com>
Call-ID: 12345601@here.com
CSeq: 1 ACK
Content-Length: 0

Applying the same procedure as above for Example 2, the resulting message is 12 bytes, and the compression ratio is 197/12=16.4.

EXAMPLE 6

Message Details

F6 BYE User B→User A
BYE sip:UserA@here.com SIP/2.0
Via: SIP/2.0/UDP there.com:5060
From: LittleGuy<sip:UserB@there.com>
To: BigGuy<sip:UserA@here.com>

CSeq: 1 BYE
Content-Length: 0

Applying step 1 to Example 6, the following substrings are generated:

TID
UserA@here.com
there.com
LittleGuy UserB@there.com
BigGuy UserA@here.com
12345601
1 BYE
0

Applying step 2 to Example 6, the substrings are parsed with the session specific codebook, as shown in Table 8, which results in a first subtotal of 10 bytes.

TABLE 8

| Original Strings | Compression |
| --- | --- |
| TID | no match |
| UserA@here.com | 2 bytes |
| there.com | 2 bytes |
| BigGuy UserA@here.com | 2 bytes |
| LittleGuy UserB@there.com | 2 bytes |
| 12345601 | 2 bytes |
| 1 Bye | no match |
| 0 | no match |

Applying step 3 to Example 6, the session specific codebook is populated as shown in Table 9.

TABLE 9

| Header | Entry |
| --- | --- |
| Index | UserB@there.com |
|  | UserA@here.com |
| Via | here.com |
|  | there.com |
| user address | UserA@here.com |
|  | UserB@there.com |
| aaddress_of_record | BigGuy UserA@here.com |
|  | LittleGuy |
|  | UserB@there.com |
| Call-ID | 12345601 |
| Contact | 100.101.102.103 |
|  | 110.111.112.113 |
| M | 49172 |
|  | 3456 |
| A | rtpmap:0 PCMU/8000 |

Applying step 4 to Example 6, the standard static dictionary reveals no matches which results in a second subtotal of 0 bytes.

Applying step 5 to Example 6, the optional static dictionary is parsed, producing Table 10, which results in a third subtotal of 4 bytes.

TABLE 10

| Original Strings | Compression |
| --- | --- |
| TID | no match |
| there.com | 1 byte |
| 1 Bye | 2 bytes |
| 0 | 1 byte |

Applying step 6 to Example 6, the rest of the substrings are compressed, a one byte template index for the TID, with LZSS to produce another 1 byte subtotal.

Combining the outputs for Example 6 gives 10+4+1=15 bytes, which is a compression ratio: 197/15=13.1.

EXAMPLE 7

Message Details

F7 200 OK User A→User B
SIP/2.0 200 OK
Via: SIP/2.0/UDP there.com:5060
From: LittleGuy<sip:UserB@there.com>
To: BigGuy<sip:UserA@here.com>
Call-ID: 12345601@here.com
CSeq: 1 BYE
Content-Length: 0

Applying the same procedure as above for Example 2, the resulting message is 12 bytes, and the compression ratio is 181/12=15.1.

FIG. 7 illustrates compression ratios achieved by the method of the present invention for other messages.

In summary, in previous studies using session specific codebooks, the codebook is populated with the fields in the messages as is and is indexed with the "From" field. In exemplary embodiments of the present invention, the field values are analyzed in addition to the whole field and keywords are extracted. As a result, the codebook of the present invention generates more matches with only a moderate increase in memory.

Further, previous studies, direct table lookup for the user addresses has been avoided because of the large memory requirement and long search time. Still further, a domain names lookup table is stored in the optional static dictionary at all SIP entities. Since the number of service providers that provide push-and-talk service is very limited, 1 byte can be assigned for each domain name.

In a Push-to-talk service, the SIP server/Proxy server/redirect server is located on the network side, which is presumed to be powerful enough to conduct a full user address search. Thus, a 4 bytes binary ID is assigned to each user address. This 4 byte ID is also assigned to each SIP entity when the device is initialized. Hence, in the INVITE message, a mobile device can simply replace it's address with this 4 byte ID.

Still further, although the present invention has been described in conjunction with compression, one of ordinary skill in the art would appreciate the decompression steps are inverse to the compression steps described above.

The present invention could also implement an inter-session dictionary feature. If a device is programmed to store recent user address history in memory, further reduction of the INVITE message for later sessions can be expected. In addition, for those who buy group services, service providers can provide a small lookup table that maps user address with 4-byte binary ID. With this approach, compression of user address (by using the 4-byte binary ID) can take place even for the first INVITE message.

The present invention utilizes a compression algorithm that combines binary coding, templates, session specific codebook and/or conventional Lempel-Ziv algorithms. The resulting compressed SIP messages are approximately ⅒ in size compared with the original messages.

As set forth above, one or more reasons for this gain is a result of one or more of the features of the present invention described above. These features include the use of a message ID, the binary encoding of selective fields, such as the service provider address, the caller user ID, the caller user name, the callee user ID name, and the calleE user name, and an IPV4 format for domain names. These features also include the binary encoding of selected numerical values, the use of a session specific codebook, and a modified indexing mechanism. Still further, these features include codebook management and session history. Still further, these features include a flexible template with fixed and variable length fields as well as a flexible template with optional fields. One or more combinations of the above features are effective in providing general purpose lossless text compression.

Further as described above, each SIP entity contains both a compressor 100 and decompressor 104. Thus, information could be shared between the compressor 100 and decompressor 104 to further reduce the message sizes.

Although the above-identified examples have been described in the context of SIP protocol messages, these examples are equally applicable to SDP, RTSP or any other known or later developed protocol.

Still further, although the features of the present invention have been described above in the context of a method, these features are also applicable to apparatus, system, and software applications, and embodying the teachings of the present application in an apparatus, system, or software would be achievable by one of ordinary skill in the art.

What has been described is merely illustrative of the application of the principles of the present invention. Those skilled in the art will readily recognize that these and various other modifications, arrangements and methods can be made to the present invention without strictly following the exemplary applications illustrated and described herein and without departing from the spirit and scope of the present invention.

We claim:

1. A method of compressing a text message for transmission, comprising:
    parsing the text message with a template to generate at least one substring to be transmitted;
    parsing the at least one substring with a session specific codebook to generate a first part of a compressed message;
    parsing the at least one substring with a first static dictionary to generate a second part of the compressed message if at least one substring includes at least one unmatched partial string after parsing the at least one substring with the session specific codebook;
    parsing the at least one substring with a second static dictionary, to generate a third part of the compressed message, if at least one partial string is still unmatched after parsing the at least one substring with a first static dictionary;
    compressing at least one partial string with a compression algorithm, if at least one partial string is unmatched after parsing with the second static dictionary; and
    combining the first part, the second part, and the third part of the compressed message to obtain a compressed message for transmission.

2. The method of compressing a text message of claim 1, wherein the text strings include domain names and the domain names are replaced with IP addresses.

3. The method of compressing a text message of claim 2, wherein the IP addresses are encoded with binary representation.

4. The method of compressing a text message of claim 1, wherein a different template is provided for each type of message.

5. The method of compressing a text message of claim 1, wherein the template includes optional fields so that the template is usable for multiple message types.

6. The method of compressing a text message of claim 1, wherein the session specific codebook is empty for a first text message compressed for transmission and entries are added as each message is compressed.

7. The method of compressing a text message of claim 1, wherein the session specific codebook includes one or more entries for each message type.

8. The method of compressing a text message of claim 1, wherein at least one of the first and second static dictionary is initialized with user specific information.

9. The method of compressing a text message of claim 1, wherein at least one of the first and second static dictionary is initialized with past session history.

10. The method of compressing a text message of claim 1, wherein the compression algorithm is a Lempel-Ziv-based compression algorithm.

11. The method of compressing a text message of claim 10, wherein the Lempel-Ziv-based compression algorithm is the Lempel-Ziv-Storer-Szymanski algorithm.

12. The method of compressing a text message of claim 1, wherein the compressed message for transmission is an session initiation protocol (SIP), session description protocol (SDP), or realtime streamlining protocol (RTSP) message (RTSP).

13. A method of compressing a text message for transmission, the method comprising:
    parsing the text message with a template to generate at least one substring to be transmitted;
    parsing the at least one substring with a session specific codebook to generate a first part of the compressed message;
    populating the session specific codebook with unknown field values if the at least one substring is unmatched after parsing the at least one substring with the session specific codebook;
    parsing the at least one substring with a first static dictionary to generate a second part of the compressed message if the at least one substring is unmatched after parsing the at least one substring with the session specific codebook;
    parsing the at least one substring with a second static dictionary to generate a third part of the compressed message if the at least one substring is still unmatched after parsing the at least one substring with the first static dictionary;
    compressing a remainder of the substrings with a compression algorithm; and
    combining the first part, the second part, and the third part of the compressed message to obtain a compressed message for transmission.

14. The method of compressing a message of claim 13, wherein a different template is provided is for each type of message.

15. The method of compressing a message of claim 13, wherein fields are added the template so that the template is usable for multiple message types.

16. The method of compressing a message of claim 13, wherein the session specific codebook is empty for a first compressed message and entries are added as each message is compressed.

17. The method of compressing a message of claim 13, wherein one or more entries of the first static dictionary and the second static dictionary are binary encoded.

18. The method of compressing a message of claim 13, wherein the session specific codebook includes one or more entries for each message type.

19. The method of compressing a message of claim 13, wherein the first static dictionary and the second static dictionary include compression values for previously encountered substrings.

20. The method of compressing a message of claim 13, wherein the first static dictionary and the second static dictionary are a single static dictionary.

21. The method of compressing a message of claim 13, wherein the compression algorithm is a Lempel-Ziv-type compression algorithm.

22. The method of compressing a message of claim 21, wherein the Lempel-Ziv-type compression algorithm is the Lempel-Ziv-Storer-Szymanski algorithm.

23. The method of compressing a message of claim 13, wherein the compressed message for transmission is an session initiation protocol (SIP), session description protocol (SDP), or realtime streamlining protocol (RTSP) message (RTSP).

* * * * *